United States Patent
Joly et al.

(10) Patent No.: US 8,525,590 B2
(45) Date of Patent: Sep. 3, 2013

(54) POWER AMPLIFIER CONTROL CIRCUIT

(75) Inventors: Christophe M. Joly, Thousand Oaks, CA (US); Yue Chen, San Jose, CA (US); Shihui Xu, Newbury Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 50 days.

(21) Appl. No.: 13/332,713

(22) Filed: Dec. 21, 2011

(65) Prior Publication Data

US 2012/0161878 A1      Jun. 28, 2012

Related U.S. Application Data

(60) Provisional application No. 61/426,459, filed on Dec. 22, 2010.

(51) Int. Cl.
*H03F 1/14* (2006.01)

(52) U.S. Cl.
USPC .............................. 330/51; 330/285

(58) Field of Classification Search
USPC .................... 330/51, 302, 285, 133
See application file for complete search history.

(56) References Cited

U.S. PATENT DOCUMENTS

| | | |
|---|---|---|
| 5,438,684 A | 8/1995 | Schwent et al. |
| 5,541,554 A | 7/1996 | Stengel et al. |
| 5,872,481 A | 2/1999 | Sevic et al. |
| 6,894,561 B2 * | 5/2005 | Apel ............................... 330/51 |
| 7,038,546 B2 * | 5/2006 | Kuriyama ..................... 330/285 |

OTHER PUBLICATIONS

International Search Report and Written Opinion of Sep. 10, 2012 for International Application No. PCT/US2011/066553, filed on Dec. 21, 2011, in 9 pages.

* cited by examiner

*Primary Examiner* — Robert Pascal
*Assistant Examiner* — Khiem Nguyen
(74) *Attorney, Agent, or Firm* — Knobbe, Martens, Olson & Bear, LLP

(57) ABSTRACT

This disclosure provides systems, apparatus, and methods for switching a portion of a power amplifier on and off during different modes of operation. In one aspect, a control circuit can include separate switches to provide bias currents to different portions of a power amplifier. The control circuit can include another switch to electrically connect outputs of the separate switches in a first mode of operation (for example, a high power mode) and electrically isolate the outputs of the separate switches in a second mode of operation (for example, a low power mode). In some implementations, a circuit element, such as a field effect transistor or a diode, can turn off one of the separate switches in the second mode. Alternatively or additionally, another circuit element, such as a field effect transistor or a diode, can prevent a power amplifier portion from turning on in the second mode.

22 Claims, 8 Drawing Sheets

POWER AMPLIFIER CONTROL CIRCUIT

CROSS-REFERENCE TO RELATED APPLICATIONS

This application claims the benefit of priority under 35 U.S.C. §119(e) of U.S. Provisional Patent Application No. 61/426,459, filed Dec. 22, 2010, titled "APPARATUS AND METHODS FOR ENABLE AND CONTROL CIRCUITS", the disclosure of which is herein incorporated by reference in its entirety.

BACKGROUND

1. Technical Field

The disclosed technology relates to electronic systems, and in particular, to power amplifiers and other amplification circuits for radio frequency (RF) electronics.

2. Description of the Related Technology

Power amplifiers boost the power of a radio frequency (RF) signal having a relatively low power. Thereafter, the boosted RF signal can be used for a variety of purposes, such as driving the antenna of a transmitter.

Power amplifiers can be included in a variety of electronic devices, such as mobile phones, to amplify a RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal. It can be important manage the amplification of a RF signal, as a particular mobile phone can be assigned a transmission time slot for a particular frequency channel. Power amplifiers can be employed to prevent signal degradation through amplification. Power amplifiers may also operate at different modes of operation (e.g., a high power mode and a low power mode), which may produce RF output signals having different ranges of power. In certain applications, such as mobile phones, different modes of operation may be designed to reduce power consumption and increase efficiency while maintaining signal quality.

However, it can be difficult to design a power amplifier to operate at more than one mode of operation without degrading performance in the various modes of operation. Accordingly, there is a need for improved power amplifiers. Furthermore, there is a need for improved apparatus and methods for controlling and/or biasing power amplifiers at multiple power modes of operation.

In addition, electronic systems may disable at least a portion of the system when the portion is unused, for example, during an idle, energy conserving mode. An enable circuit can enable and/or refresh a voltage supply from a voltage source (e.g., a battery) to at least a portion of the electronic system. In a specific example, a mobile phone that includes a power amplifier can disable at least a portion of the power amplifier using the enable circuit when the portion of the power amplifier is not in operation. However, in this example, the power amplifier may still include a physical connection to a voltage source in through the enable circuit. As a result, leakage current may still be consumed in the idle mode. This leakage can lead to additional power consumption and/or a reduced battery life. Accordingly, a need exists for reducing the leakage current.

SUMMARY OF CERTAIN INVENTIVE ASPECTS

One aspect of this disclosure is a power amplifier system that includes a power amplifier and a control circuit. The power amplifier includes at least a first portion and a second portion. The control circuit includes a first switch, a second switch, and a third switch. The first switch is configured to provide a first bias current to the first portion of the power amplifier. The second switch is configured to provide a second bias current to the second portion of the power amplifier in a first mode of operation. The third switch is configured to electrically connect an output of the first switch and an output of the second switch in the first mode of operation and to electrically isolate the output of the first switch and the output of the second switch in a second mode of operation.

In some implementations, the bias currents applied to the first portion of the power amplifier and the second portion of the power amplifier can be substantially balanced in the first mode of operation.

According to certain implementations, the control circuit can include one or more circuit elements configured to turn on both the first switch and the second switch.

In accordance with some implementations, the control circuit can include a fourth circuit element configured to turn off the second switch in the second mode of operation, so as to turn off the second portion of the power amplifier. The first switch, the second switch, the third switch, and the fourth circuit element can each include a GaAs transistor. The fourth circuit element can be a field effect transistor in some implementations. The fourth circuit element can be a diode in some other implementations. The diode can be, for example, a Schottky diode.

In certain implementations, the control circuit can include a fifth circuit element configured to prevent the second switch from turning on during the second mode of operation. The fifth circuit element can include at least one of a field effect transistor or a diode.

According to a number of implementations, each of the first switch, the second switch, and the third switch can include a field effect transistor. For instance, each of the first switch, the second switch, and the third switch can be CMOS devices.

According to various implementations, the first switch and the second switch can each be configured as a source follower.

In some implementations, the power amplifier can further include a third portion. The control circuit can further include an additional switch configured to provide a third bias current to the third portion of the power amplifier and another additional switch configured to electrically connect an output of the first switch and an output of the additional switch in at least one mode of operation and to electrically isolate the output of the first switch and the output of the additional switch in at least one mode of operation.

In certain implementations, the power amplifier system can further include an enable circuit configured to selectively provide current from a voltage source to generate at least one of the first input voltage or the second input voltage based on an enable input. The enable circuit can be configured to pass substantially all of the current from the voltage source through one or more circuit elements driving the current from the enable circuit when the enable circuit is enabled.

Another aspect of this disclosure is a control circuit. The control circuit includes a first switch, a second switch, and a third switch. The first switch is configured to provide a first bias current to a first portion of an amplification circuit. The second switch is configured to provide a second bias current to a second portion of the amplification circuit in a first mode of operation. The third switch is configured to electrically connect an output of the first switch and an output of the second switch in the first mode of operation and to electrically isolate the output of the first switch and the output of the second switch in a second mode of operation.

In certain implementations, the first mode of operation can be a high power mode and the second mode of operation can be a low power mode.

According to some implementations, the control circuit can include a fourth circuit element configured to turn off the second switch in the second mode of operation, so as to turn off the second portion of the amplification circuit. The fourth circuit element can include at least one of a field effect transistor or a diode.

In accordance with various implementations, the control circuit can include a fifth circuit element configured to prevent the second switch from turning on during the second mode of operation.

Another aspect of this disclosure is a method of controlling a power amplifier. The method includes providing current to power amplifier portions via a control circuit having at least two current paths to the power amplifier portions. The two current paths share a common control loop. The method also includes providing current to the power amplifier portions via the two current paths. In addition, the method includes selectively isolating the two current paths. Further, the method includes disabling a first current path of the two current paths while the two current paths are selectively isolated.

In some implementations, the method can also include preventing a power amplifier portion controlled by the first current path from activating when the first current path is disabled. Alternatively or additionally, the method can include electrically connecting the two current paths and enabling the first current path, after the selectively isolating and the disabling.

Another aspect of this disclosure is an electronic system that includes an enable circuit including BiFET devices. The enable circuit is configured to selectively provide current from a voltage source to a bias output based on an enable input. The enable circuit is configured to pass substantially all of the current from the voltage source through one or more of the BiFET devices driving the bias output when the enable circuit is enabled.

Another aspect of this disclosure is an electronic system that includes an enable circuit configured to selectively provide current from a voltage source to a bias output based on an enable input. The enable circuit is configured to pass substantially all of the current from the voltage source through one or more circuit elements driving the bias output when the enable circuit is enabled.

In some implementations, the one or more circuit elements can include a field effect transistor having a gate, a source, and a drain, in which the field effect transistor can provide current from the voltage source to the bias output by passing current from the drain to the source. The field effect transistor can be a GaAs field effect transistor. The enable circuit can be formed by a BiFET process. In some implementations, The gate of the field effect transistor can be electrically connected to the bias output.

According to certain implementations, the enable circuit further can include a second field effect transistor configured to control the gate of the field effect transistor in response to the enable input, in which the second field effect transistor has a second gate, a second source, and a second drain. The second field effect transistor can be a BiFET device. Alternatively or additionally, the second source can be electrically connected to the enable signal and the second drain can be electrically coupled to the gate. In some implementations, the second gate can be electrically connected to the bias output.

In accordance with various implementations, the electronic system can include a source follower configured to receive the bias output and provide a bias voltage to a power amplifier.

Yet another aspect of this disclosure is a method of reducing leakage current in an enable circuit. The method includes generating a bias voltage at an output node by passing a voltage from a voltage source via one or more circuit element of the enable circuit, the one or more circuit elements including a GaAs field effect transistor; substantially disabling current flow from the voltage source to the output node; and leaking substantially all current from the voltage source through the one or more circuit elements when the current flow from the voltage source to the output node is disabled.

This disclosure also relates to means to perform any of the technical features disclosed herein. For instance, another aspect of this disclosure is an apparatus that includes means for amplifying a radio frequency signal and means for controlling the amplifying means. The amplifying means includes means for providing a first bias current to a first portion of the amplification means. The amplifying means also includes means for providing a second bias current to a second portion of the amplification means. The amplifying means also includes means for electrically connecting an output of the means for providing the first bias current and an output of the means for providing the second bias current in the first mode of operation and to electrically isolate the output of the means for providing the first bias current and the output of the means for providing the second bias current in a second mode of operation.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The headings provided herein are for convenience only and do not necessarily affect the scope or meaning of the claimed invention.

Provided herein are various non-limiting examples of devices and methods for facilitating amplification of a radio frequency (RF) signal.

Generally described, aspects of this disclosure relate to power amplifier control circuits and/or enable circuits. The control circuit can switch a portion of a power amplifier on and off without significantly degrading performance in multiple modes of operation. The control circuit can split a bias circuit source follower (or a bias circuit emitter follower) of at least two power amplifier portions into separate devices. A switch between the separate devices can isolate current paths to the two power amplifier portions in certain modes of operation (for example, a low power mode) and electrically connect the current paths to the two power amplifier portions in other modes of operation (for example, a high power mode). In this way, only one of the two power amplifier portions can be on during one mode of operation and the two power amplifier portions can be on during the other mode of operation. The separate bias circuit source followers can be controlled by a common control circuitry, such as a common control loop. In some implementations, a circuit element (such as a field effect transistor or a diode) can turn off the source follower to one of the power amplifier portions when the two portions are electrically isolated by the switch between the separate source followers. Alternatively or additionally, a different circuit element (such as a field effect transistor or a diode) can prevent a power amplifier portion from turning on when the current paths are electrically isolated. For instance, the different circuit element can prevent the power amplifier portion from turning on in low mode under high drive of the power amplifier. Although the control circuits may be described with reference to power amplifiers for illustrative purposes, the control circuits described herein may be implemented in connection with any other suitable amplification circuits.

This disclosure also relates to enable circuits having a single branch of circuit elements electrically connected to the voltage source. Such an enable circuit can, among other things, reduce leakage current consumed when the enable circuit is not activated, for example, during an idle mode and/or a sleep mode. In some instances, the enable circuit can be implemented using GaAs BiFET devices. The enable circuit can implement a non-inverting logic function. The enable circuits described herein may be included in any suitable electronic system with a need for a low leakage enable circuit. As one non-limiting example, such enable circuits can be included in a power amplifier system in a mobile phone.

Figure 1:
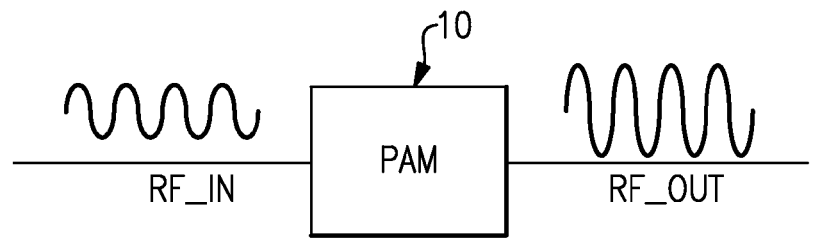
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers. The power amplifier module 10 can be implemented in a variety of electronic devices, such as a mobile device.

Mobile Device

Figure 2:
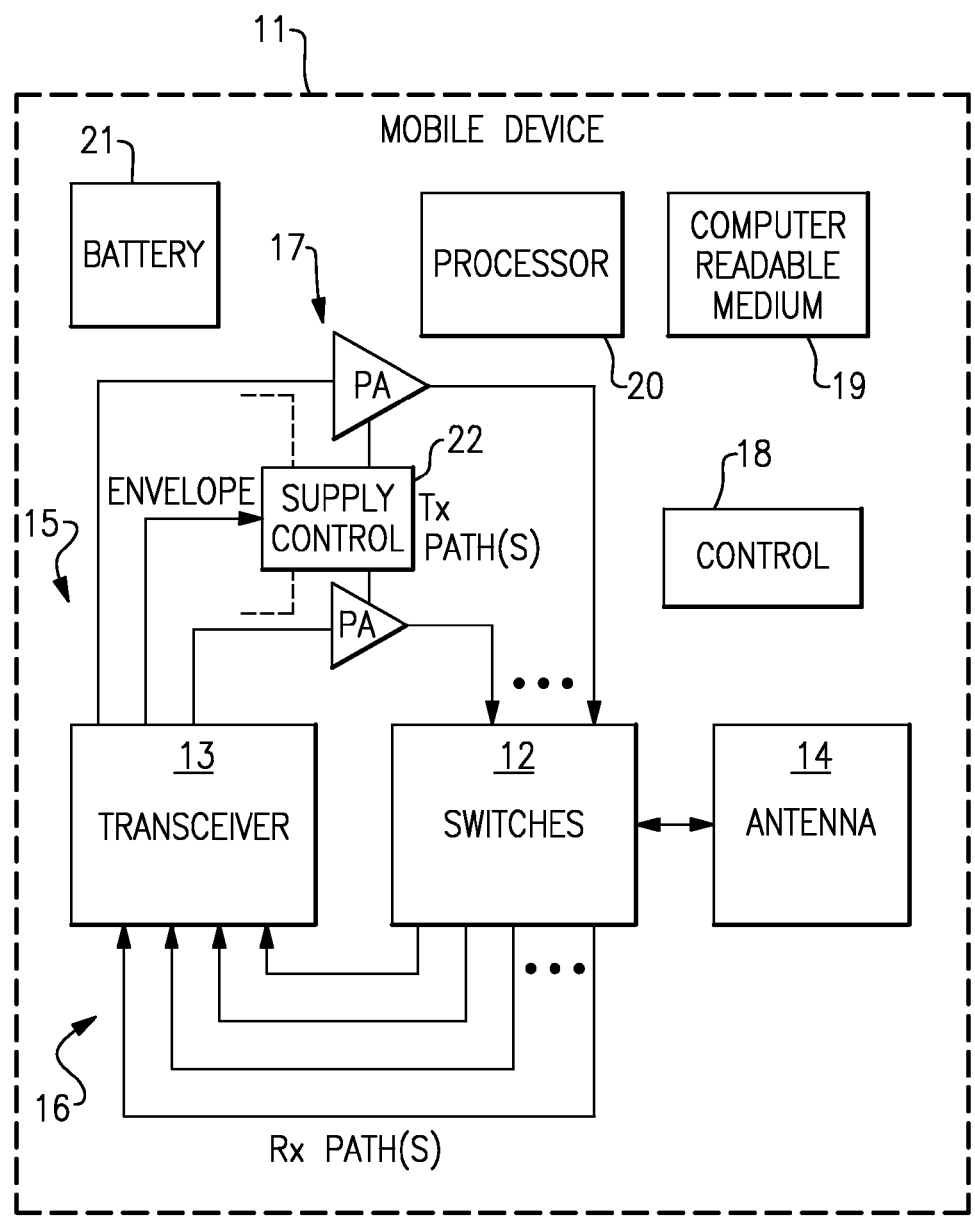
FIG. 2 is a schematic block diagram of an example wireless device that can include one or more of the power amplifier modules of FIG. 1.

FIG. 2 is a schematic block diagram of an example mobile device 11 that can include one or more of the power amplifier modules of FIG. 1. The mobile device 11 can include power amplifiers implementing one or more features of the present disclosure.

The example mobile device 11 depicted in FIG. 2 can represent a multi-band and/or multi-mode device such as a multi-band/multi-mode mobile phone. By way of example, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 900 MHz and 1900 MHz bands.

One or more features of the present disclosure can be implemented in the foregoing example modes and/or bands, and in other communication standards. For example, 3G and 4G are non-limiting examples of such standards.

In certain embodiments, the mobile device 11 can include one or more of a transceiver component 13, a switching component 12, an antenna 14, power amplifiers 17, a control component 18, a computer readable medium 19, a processor 20, a battery 21, and a supply control block 22.

The transceiver component 13 can generate RF signals for transmission via the antenna 14. Furthermore, the transceiver component 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the mobile device 11 can be provided with one or more antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For example, two example power amplifiers 17 shown can represent amplifications associated with different power output configurations (e.g., low power output and high power output), and/or amplifications associated with different bands.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with.

To facilitate switching between receive and transmit paths, the switching component 12 can be configured to electrically connect the antenna 14 to a selected transmit or receive path.

Thus, the switching component 12 can provide a number of switching functionalities associated with an operation of the mobile device 11. In certain embodiments, the switching component 12 can include a number of switches configured to provide functionalities associated with, for example, switching between different bands, switching between different power modes, switching between transmission and receiving modes, or any combination thereof. Various non-limiting examples of such switches are described herein in greater detail.

FIG. 2 shows that in certain embodiments, a control component 18 can be provided, and such a component can be configured to provide various control functionalities associated with operations of the switching component 12, the power amplifiers 17, the supply control block 22, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture which implements the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in the flowchart and/or block diagram block or blocks.

The illustrated mobile device 11 also includes the power control 22, which can be used to provide a power supply to one or more of the power amplifiers 17. For example, the supply control block 22 can include an enveloping tracking module configured to vary the supply voltage provided to the power amplifiers 17 based upon an envelope of the RF signal to be amplified.

The supply control block 22 can be electrically connected to a battery 21, and the supply control block 22 can be configured to vary the voltage provided to the power amplifiers 17 based on an envelope of the RF signal to be amplified. The battery 21 can be any suitable battery for use in the mobile device 11, including, for example, a lithium-ion battery. As will be described in detail further below, by varying the voltage provided to the power amplifiers, the power consumption of the battery 21 can be reduced, thereby improving performance of the mobile device 11.

Power Amplifier System

Figure 3:
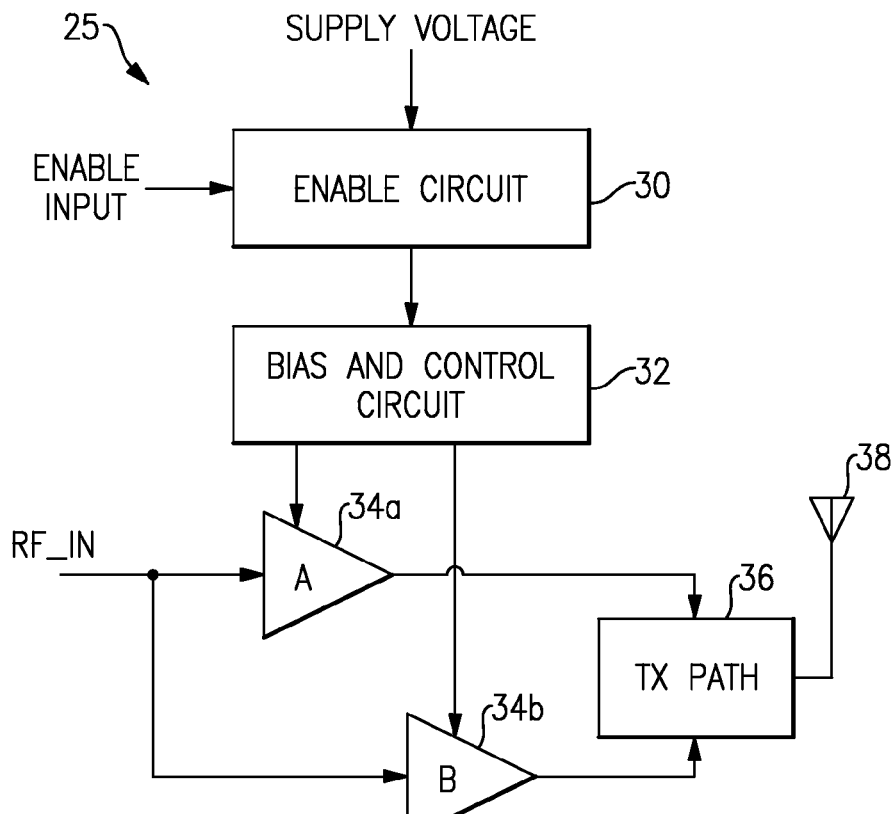
FIG. 3 is a schematic block diagram of an example power amplifier system.

FIG. 3 is a schematic block diagram of part of an example power amplifier system 25. The illustrated power amplifier system 25 includes an enable circuit 30, a bias and control circuit 32, a first power amplifier portion 34a, a second power amplifier portion 34b, a transmission path 36, and an antenna 38.

The enable circuit 30 can receive a supply voltage from a voltage source, such as a battery. An enable input signal can selectively control the enable circuit 30 to provide a bias voltage to the bias and control circuit 32. The bias and control circuit 32 can control modes of operation of the first power amplifier portion 34a and the second amplifier 34b. For example, the first power amplifier portion 34a may be on during both a lower power and a high power mode, and the second power amplifier portion 34b may be on during the high power mode and off during the low power mode. In this example, power can be saved by disabling the second power amplifier portion 34b in the low power mode. In some implementations, the power amplifier portions 34a and 34b may share the bias and control circuit 32 having common control elements, thereby saving die area and/or power compared to implementing separate bias and control circuits for each power amplifier portion.

The bias and control circuit 32 can include any suitable circuitry to control a power amplifier. One or more of the power amplifier portions 34a, 34b may amplify the RF input signal RF_IN and provide an amplified output to the transmission path 36. The transmission path 36 may include, for example, one or more phase shifters, switches, variable impedance elements, the like, or any combination thereof.

The power amplifier system 25 can be implemented in a variety of contexts. For illustrative purposes, non-limiting examples will be described. The power amplifier system 25 can be implemented in a load-insensitive power amplifier module. The power amplifier module can include, for example, a fully matched 10-pad surface mount module developed for Wideband Code Division Multiple Access (WCDMA) applications. The power amplifier module can be small and efficient. The power amplifier module can provide full 880-915 MHz bandwidth coverage in a single compact package. Because of high efficiencies attained throughout the entire power range, the power amplifier module can deliver advantageous talk-time features when implemented in a mobile device. The power amplifier module can meet the stringent spectral linearity requirements of High Speed Downlink Packet Access (HSDPA), High Speed Uplink Packet Access (HDUPA), and/or Long Term Evolution (LTE) data transmission with high power added efficiency. Power amplifiers, such as power amplifiers implemented in a mobile device 11, operating in accordance with HSDPA, HDUPA, and/or LTE can operate in one or more frequency bands such as approximately 824-915 MHz and approximately 1710-1980 MHz. In some implementations, a directional coupler integrated into the power amplifier module can eliminates the need for an external coupler.

According to some implementations, a single Gallium Arsenide (GaAs) Microwave Monolithic Integrated Circuit (MMIC) can include all active circuitry included in the power amplifier module. The MMIC can include on-board bias circuitry, as well as input and interstage matching circuits. Output matching into a 50-ohm load can be realized off-chip within the power amplifier module package to optimize efficiency and power performance, in accordance with some implementations.

The power amplifier module can operate as a load-insensitive power amplifier providing high linearity in the presence of high RF mismatch up to 3:1 VSWR, according to certain implementations. The power amplifier module can be manufactured with a GaAs Heterojunction Bipolar Transistor (HBT) BiFET process that provides for all positive voltage DC supply operation while maintaining high efficiency and good linearity. No VREF voltage is needed in some implementations. Power down can be accomplished by de-asserting an enable voltage. A typical "off" leakage can be a few microamperes with full primary voltage supplied from a battery in various implementations, and an external supply side switch may not be needed.

Enable Circuit

During certain modes of operation, an electronic system may disable at least a portion of the system to save power, for example, in a sleep and/or idle mode. An enable circuit can be used to enable and/or refresh power from the electronic system. Yet when the enable circuit disables current from a voltage source, such as a battery, from flowing to the electronic system, leakage current may occur. Thus, an amount of leakage current consumed by an enable circuit may determine the quality of the enable circuit.

Due to a relatively simple logical functionality and a desire to minimize leakage current, enable circuits may be implemented with a relatively small number of circuit elements. Some conventional enable circuits include two branches of circuit elements, such as field effect transistors, electrically connected to a supply voltage in order to implement a non-inverting logic function.

Figure 4:
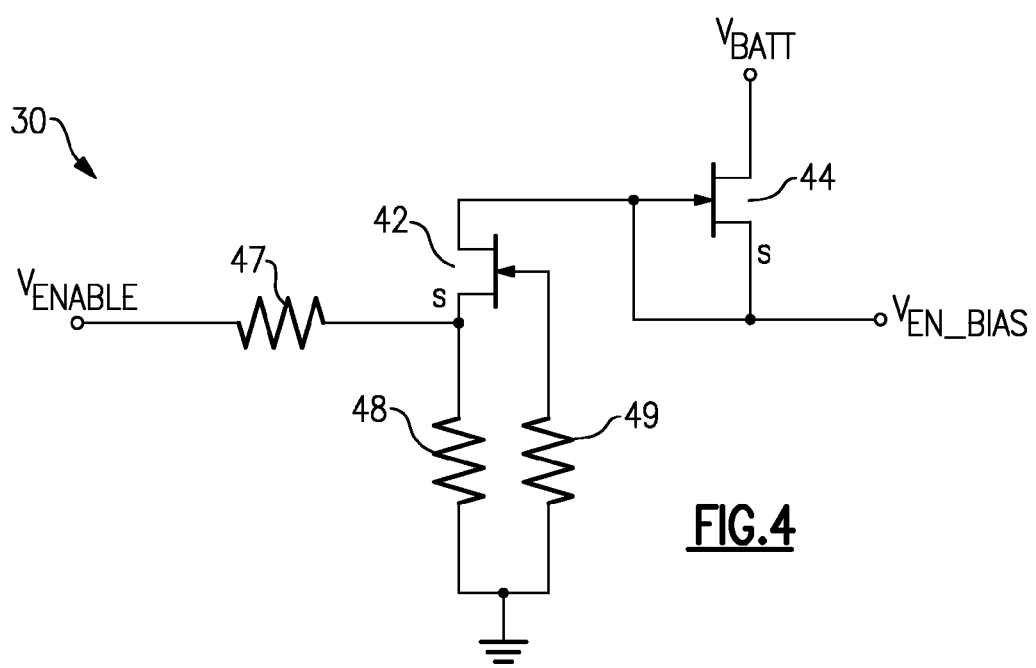
FIG. 4 is a schematic diagram of an illustrative enable circuit according to an embodiment.

FIG. 4 is a schematic diagram of an illustrative enable circuit 30 according to an embodiment. The enable circuit 30 illustrated in FIG. 4 includes a single branch of circuit elements electrically connected to the voltage source. At the same time, the enable circuit 30 can implement a non-inverting logic function.

In the embodiment illustrated in FIG. 4, enable circuit 30 includes a first field effect transistor 42, a second field effect transistor 44, a first resistor 47, a second resistor 48, and a third resistor 49. An enable input voltage $V_{ENABLE}$ can be applied to a source of the first field transistor 42 via the first resistor 47. A ground reference potential can also be applied to the source of the first field effect transistor 42 via the second resistor 48. The ground reference potential can be applied to a gate of the first field effect transistor 42 via the third resistor 49. A drain of the first field effect transistor 42 can be coupled to a gate of the second field effect transistor 44. A drain of the second field effect transistor 44 can be coupled to a power supply voltage $V_{BATT}$. The gate of the second field effect transistor 44 can be coupled to a source of the second field effect transistor 44. A voltage generated at the source of the second field effect transistor 44 can be an enable bias voltage output $V_{EN\_BIAS}$. The enable bias voltage output $V_{EN\_BIAS}$ can be provided to the bias and control circuit 32 (FIG. 3).

The enable circuit 30 can pass current from the power supply voltage $V_{BATT}$ to generate the enable bias voltage output $V_{EN\_BIAS}$ when an enable input $V_{ENABLE}$ is asserted (for example, when $V_{ENABLE}$ is at a voltage level corresponding to a logic "1" value). The first field effect transistor 42 can turn off when the enable input $V_{ENABL}$ is at a voltage level corresponding to a logic "1" value (for example, 1.8 V). This can cause the gate of a second field effect transistor 42 to float high. Then the second field effect transistor 42 can pass current from the supply voltage $V_{BATT}$ to the enable bias voltage output $V_{EN\_BIAS}$. When the enable input $V_{ENABLE}$ is at a voltage level corresponding to a logic "0" value (for example, 0 V), then the first field effect transistor 42 can turn off the second field effect transistor 44, thereby turning off the path from the supply voltage $V_{BATT}$ to the enable bias voltage output $V_{EN\_BIAS}$.

As illustrated in FIG. 4, the enable circuit 30 can selectively provide current from a voltage source to an enable bias output based on an enable input. The enable circuit 30 can be configured to pass substantially all of the current from the power supply through one or more circuit elements driving the bias enable output when the enable circuit 30 is enabled. For instance, substantially all of the current from the power supply can be passed to the bias enable output via the second field effect transistor 44. Similarly, one or more field effect transistors in parallel with the second field effect transistor 44 can also drive the bias enable output such that substantially all of the current from the power supply can be passed to the bias enable output via the second field effect transistor 44 and the one or more field effect transistors in parallel with the second field effect transistor 34.

The second field effect transistor 44 may leak when it is turned off. Yet, in the enable circuit 30, the first filed effect transistor 42 may not contribute significantly to the total leakage current of the enable circuit 30.

The enable circuit 30 can be implemented in any electronic circuit with a need for an enable circuit. In some implementations, the enable circuit 30 may include GaAs field effect transistors. In some of these implementations, the GaAs field effect transistors may be formed via a BiFET process. Accordingly, the enable circuit 30 can reduce leakage current without use of bipolar transistors, such as PNP transistors, or CMOS transistors, such as PMOS transistors.

Figure 5:
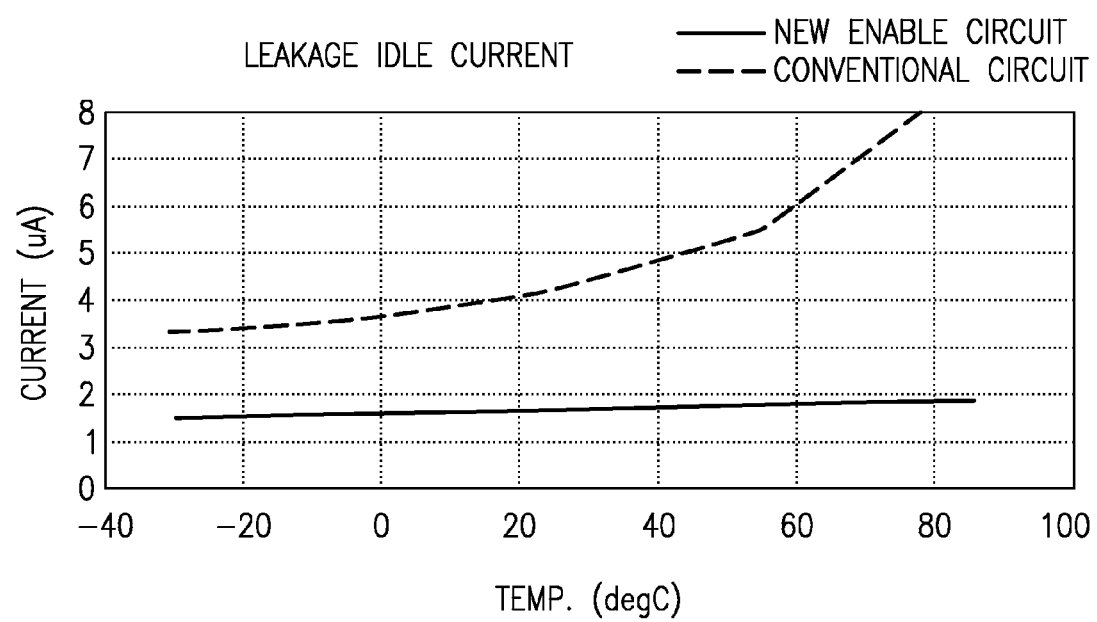
FIG. 5 graphically illustrates the leakage current associated with the enable circuit of FIG. 4 compared to a conventional enable circuit.

FIG. 5 graphically illustrates the leakage current associated with the enable circuit of FIG. 4 compared to a conventional enable circuit. As shown in FIG. 5, the enable circuit of FIG. 4 may consume less than half as much leakage current as some conventional enable circuits in an idle mode of operation at temperatures ranging from about −30° C. to 85° C. At higher temperatures, the enable circuit of FIG. 4 can show a greater reducing in leakage current during an idle mode of operation compared to conventional circuits. For instance, as shown in FIG. 5, the enable circuit of FIG. 4 may consume less than a third as much leakage current as some conventional enable circuits in an idle mode of operation at temperatures ranging from about 60° C. to 85° C. Less leakage current can result in, for example, longer battery life in sleep and/or idle modes.

Figure 6:
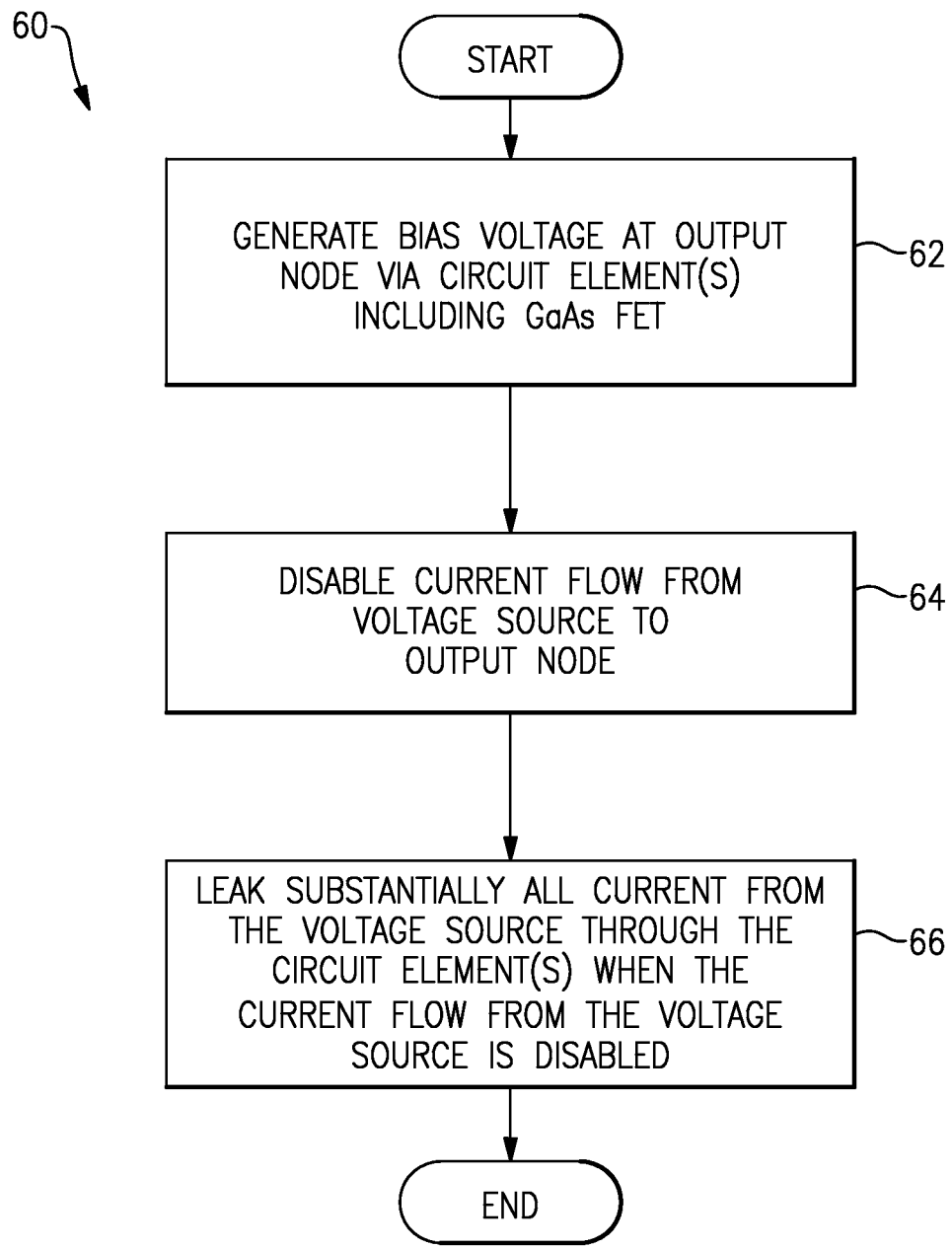
FIG. 6 is a flow diagram of an illustrative method of using an enable circuit according to an embodiment.

FIG. 6 is a flow diagram of an illustrative method 60 of using an enable circuit according to an embodiment. The method 60 can reduce leakage current in an enable circuit compared to leakage current generated by conventional enable circuits. At block 62, one or more circuit element of the enable circuit can generate a bias voltage at an output node by passing a voltage from a voltage source. The one or more circuit elements can include a GaAs field effect transistor. In some implementations, the GaAs field effect transistor can include a high electron mobility transistor (HEMT) device such as a pseudomorphic HEMT (pHEMT) device or a metamorphic HEMT (mHEMT) device. Current flow from the voltage source to the output node can be substantially disabled at block 64. For example, the enable circuit can be disabled. Then, at block 66, substantially all current from the voltage source can be leaked through the one or more circuit elements that drive the output node when the current flow from the voltage source to the output node is disabled.

Control Circuit

Figure 7:
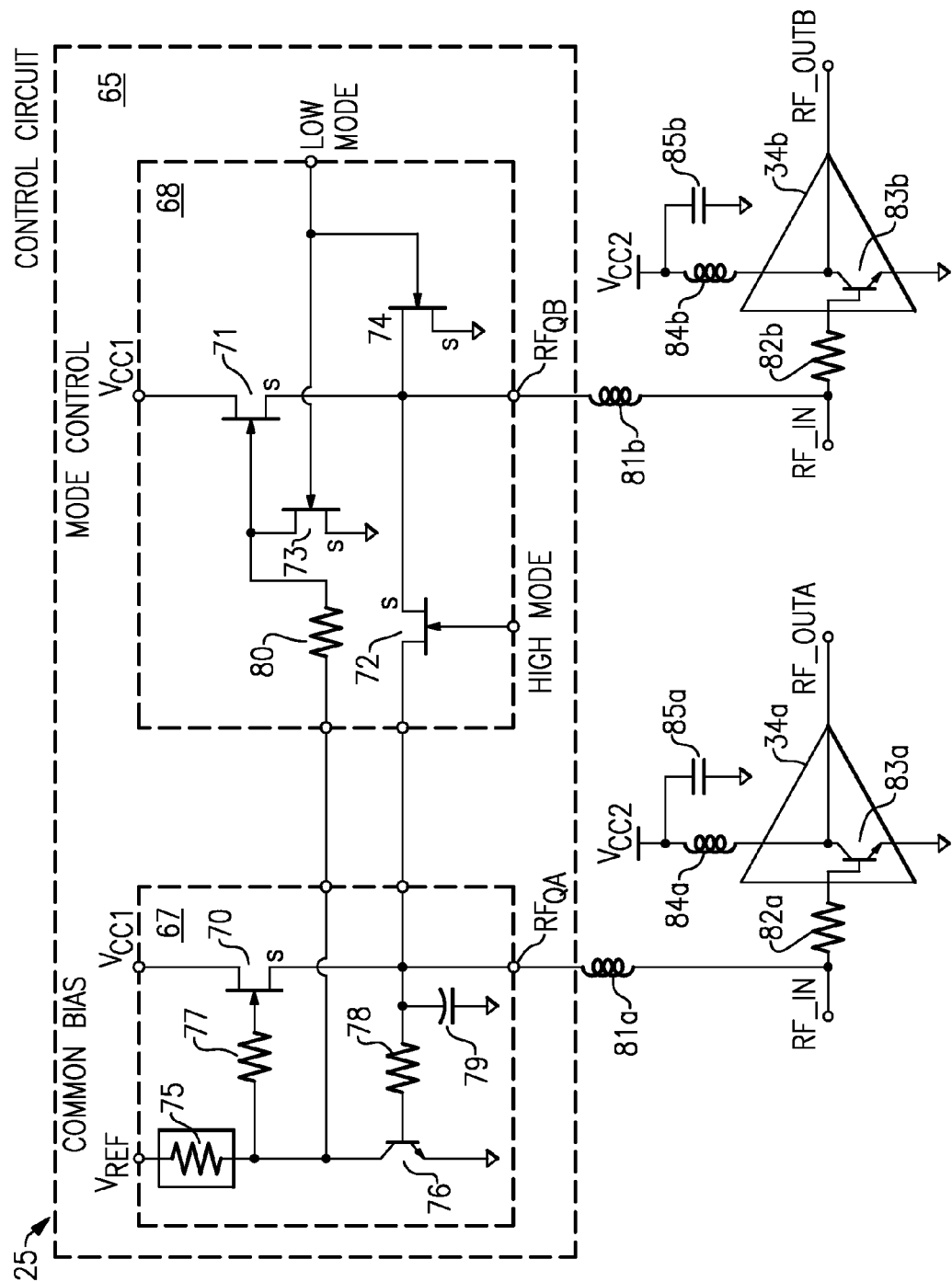
FIG. 7 is a schematic diagram of a power amplifier system that includes an illustrative control circuit for controlling a power amplifier according to an embodiment.
Figure 8A:
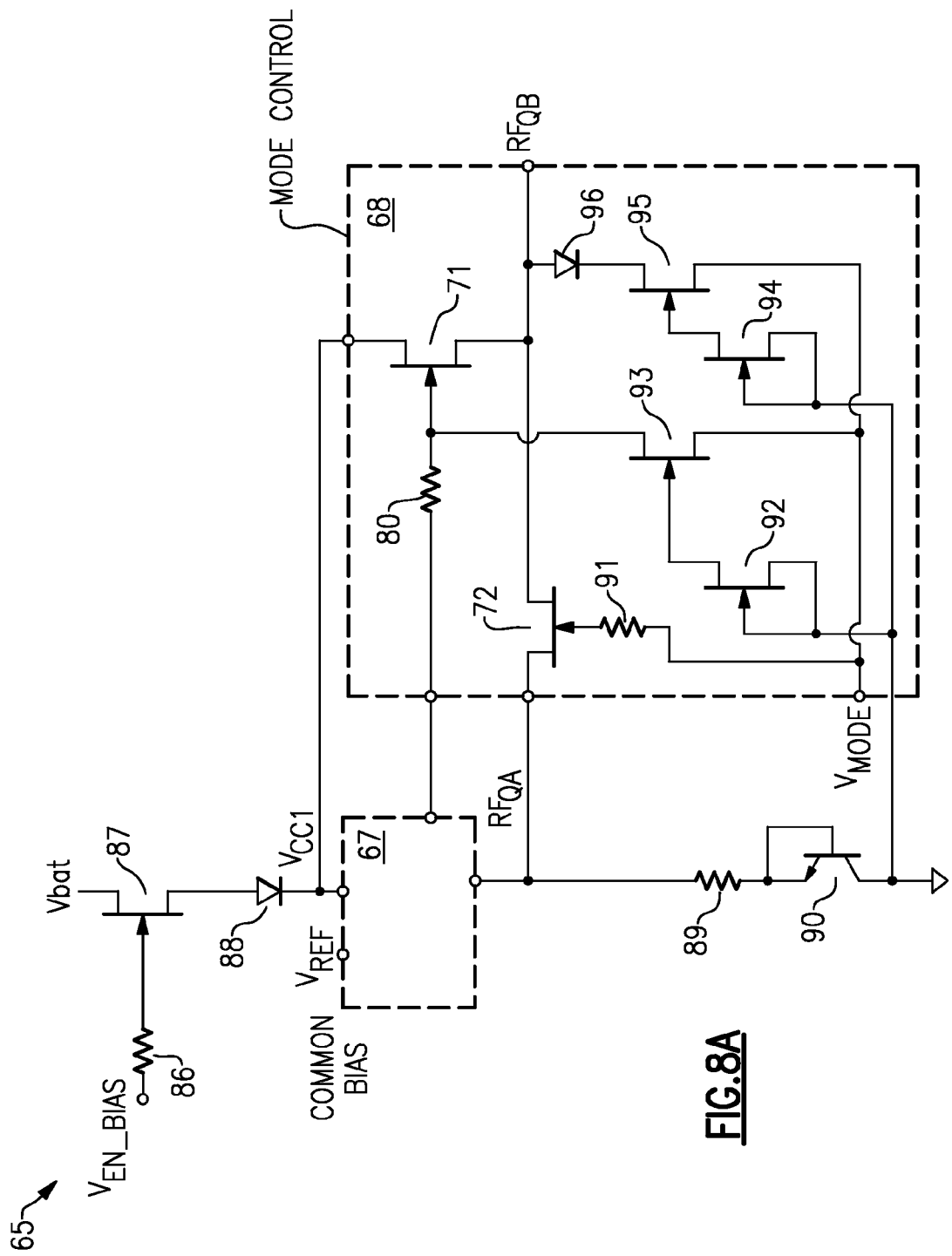
FIGS. 8A and 8B are schematics diagrams of illustrative control circuits for controlling amplification circuits, according to various embodiments.
Figure 8B:
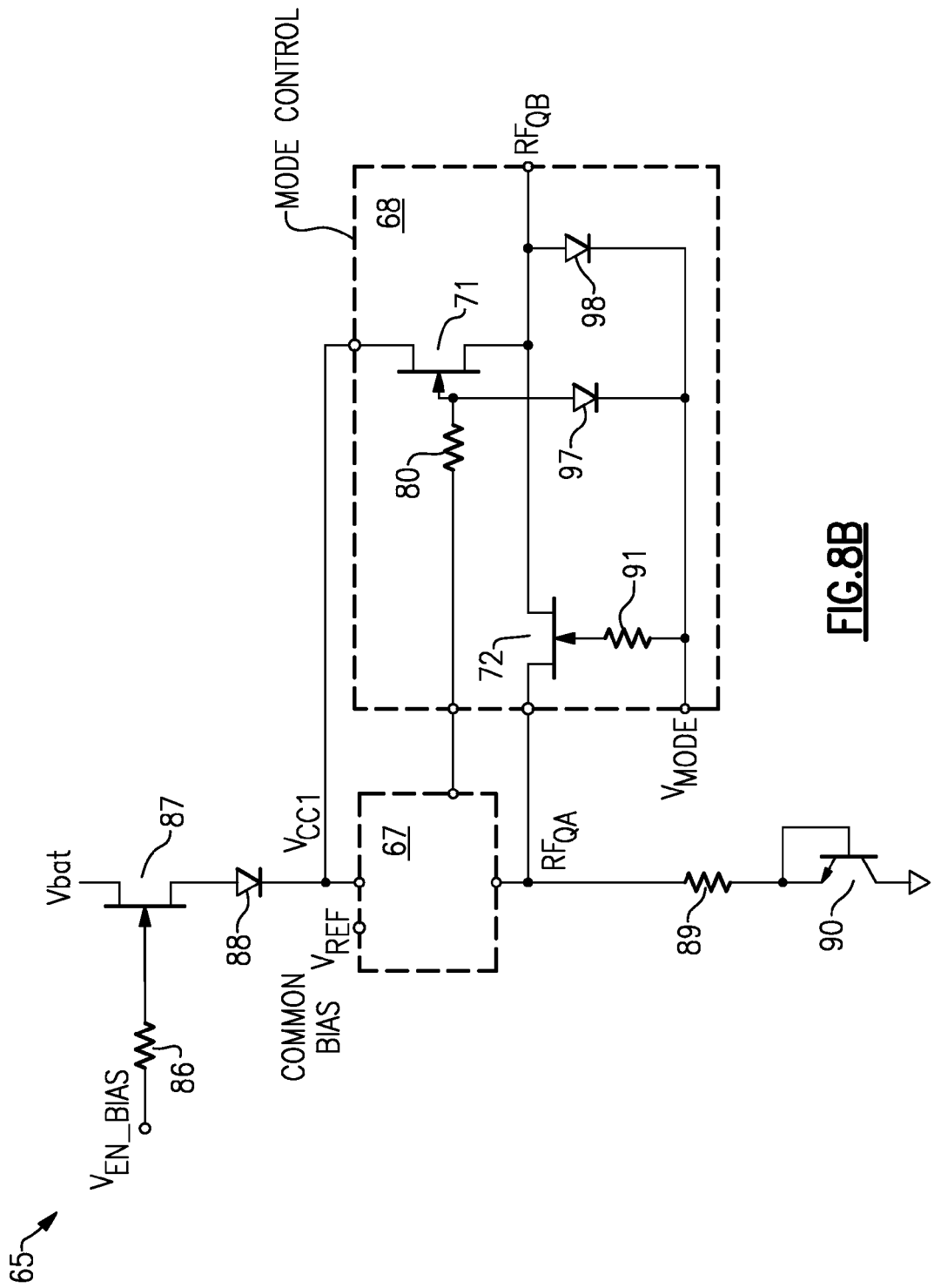

The example control circuits 65 illustrated in FIGS. 7, 8A, and 8B can switch on/off a portion of a power amplifier without significant performance degradation. Although the example control circuits 65 may be described in the context of power amplifier systems, any combination of features described with reference to the example control circuit 65 described herein may be applied to any other suitable amplification circuit. Due to a large dynamic range of power desired by certain applications (for example, mobile phones), multi-mode power amplifiers can be configured to generate radio frequency (RF) signals while operating with high linearity and/or efficiency during multiple different modes of operation (for example, a low power mode and a high power mode). To operate in various modes of operation, part of a power amplifier (or power amplifier stage) can be switched off, for example, in a lower power mode. The part of the power amplifier that is switched off can later be switched on, for example, in a higher power mode.

Previous designs that have switched off part of a power amplifier in a lower power mode have encountered problems with symmetry and/or ballasting in a high power mode. In addition, previous designs have encountered difficulties keeping the disabled portion of the power amplifier off during higher power levels of low power operation. The control circuits 65 illustrated in FIGS. 7, 8A, 8B, the like, or any combination thereof, can overcome one or more of these problems, among others.

As illustrated in the example control circuits 65, a bias circuit source follower for a first power amplifier portion 34a and a second power amplifier portion 34b is split into different devices, such as a first switch 70 and a second switch 71. This concept can also be applied to splitting a bias current emitter follower into separate devices. A third switch 72 coupled between the first switch 70 and the second switch 71 to electrically connect or electrically isolate the first switch 70 and the second switch 71 without significantly ballasting the second power amplifier portion 34b. In some implementations, the third switch 72 can isolate the first power amplifier portion 34a and the second power amplifier portion 34a in a low operating mode, while the first power amplifier portion 34a and the second the power amplifier portion 34b share common control circuitry. The common control circuitry can include a base band impedance control element, which can include a high value capacitor. A fourth circuit element, such as a fourth switch 73 and/or a diode, can shut off the current the second power amplifier portion 34b by turning off the second switch 71. In the example control circuits 65 illustrated in FIGS. 7, 8A, and 8B, the second switch 71 is a source follower switch. In some implementations, a fifth circuit element, such as a fifth switch 74 and/or a diode, can be configured to prevent the second power amplifier portion 34b from turning on in low mode, for example, under a high drive of the power amplifier.

The example control circuits 65 of FIGS. 7, 8A, and 8B can overcome the problems of some conventional designs, without increasing power consumption. The separate source follower switches 70, 71 can be smaller devices than a combined source follower switch. Thus, the example control circuits may not consume additional die area compared to previous control circuits. Accordingly, the example control circuits 65 can allow for efficient operation in a low power mode and a balanced high power mode with lower ballasting, which can lead to improved device uniformity.

FIG. 7 is a schematic diagram of a power amplifier system 25 that includes an illustrative control circuit 65 for controlling a power amplifier according to an embodiment. The control circuit 65 can be included in the bias and control circuit 32 of FIG. 3 in some implementations. The power amplifier system 25 can include the control circuit 65, a first power amplifier portion 34a, and a second amplifier portion 34b. The control circuit 65 can provide a first bias current $I_{BA}$ to cause a first quiescent current $I_{QA}$ to flow through the first power amplifier portion 34a and a second bias current $I_{BB}$ to cause a first quiescent current $I_{QB}$ to flow through the second power amplifier portion 34b. For example, the control circuit 65 can generate the first bias current $I_{BA}$ that is applied to the base of the bipolar transistor 83a and the second bias current $I_{BB}$ that is applied to the base of the bipolar transistor 83b. The control circuit 65 can include a common bias circuit 67 and a mode control circuit 68. The common bias circuit 67 can generate the first bias current $I_{BA}$ for the first power amplifier portion 34a and control the current level of the first bias current $I_{BA}$. The mode control circuit 68 can turn the second power amplifier portion 34b on for certain modes of operation and off for other modes of operation.

The common bias circuit 67 can generate the first bias current $I_{BA}$ for the first power amplifier portion 34a based on a reference voltage $V_{REF}$ and a control circuit supply voltage $V_{CC1}$. The common bias circuit 67 can include a first switch 70 to generate the first bias current $I_{BA}$. The first bias current $I_{BA}$ can be provided to the input of the first power amplifier portion 34a via a choke inductor 81a. The first switch 70 can be a field effect transistor having a gate, a source, and a drain as illustrated in FIG. 7. In other implementations, the first switch can be a bipolar transistor. The first switch 70 can be configured as a source follower (or an emitter follower). A control loop can control the first bias current $I_{BA}$ such that the first bias current $I_{BA}$ is at a desired level. An output terminal of the first switch 70, such as a source when the first switch 70 is a field effect transistor, can be coupled to a node $RFQ_A$. As illustrated, the first switch 70 can have a drain configured to receive the control circuit supply voltage $V_{CC1}$ and a source configured to provide the first bias current $I_{BA}$. A gate of the first switch 70 can be controlled by the control loop. The source of the first switch 70 can be coupled to a base of a bipolar transistor 76. In some implementations, a grounded capacitor 79 and a resistor 78 can be coupled between the source of the first switch 70 and the base of the bipolar transistor 76. The bipolar transistor 76 can have a emitter coupled to a ground node. An collector of the bipolar transistor 76 can be coupled to the gate of the first switch 70. In some implementations, a resistor 77 can be coupled between the emitter of the bipolar transistor 76 and the gate of the first switch 70. The collector of the bipolar transistor can also be coupled to a first end of a baseband impedance element 75, which can include a high value capacitor and/or a resistor. A second end of the baseband impedance element 75 can be electrically coupled to the reference voltage $V_{REF}$.

As illustrated, the common bias circuit 67 can provide the bias current $I_{BA}$ to an input of the first power amplifier portion 34a when the power amplifier system 25 is enabled by the control circuit supply voltage $V_{CC1}$. In contrast, the mode control circuit 68 can provide the bias current $I_{BB}$ to the second power amplifier portion 34b in certain modes of operation and to deactivate the second power amplifier portion 34b by ceasing to provide bias current $I_{BB}$ in other modes of operation.

The mode control circuit 68 can include a second switch 71, a third switch 72, a fourth switch 73, and a fifth switch 74. The mode control circuit 68 can share the control loop that controls the gate of the first switch 70 in the common bias circuit 67. As illustrated in FIG. 7, a gate of the second switch 71 can be electrically coupled to the collector of the bipolar transistor 76. For instance, a first end of a resistor 80 can be coupled to the emitter of the bipolar transistor 76 and a second end of the resistor 80 can be coupled to the gate of the second switch 71. The second switch 71 can be a field effect transistor configured as a source follower as illustrated in FIG. 7 or a bipolar transistor configured as an emitter follower. For example, the second switch 71 can have a drain configured to receive the control circuit supply voltage $V_{CC1}$ and a source configured to provide the bias current $I_{BB}$ to the second power amplifier portion 34b via choke inductor 81b. An output terminal of the second switch 71, such as a source when the second switch 71 is a field effect transistor, can be coupled to a node $RFQ_B$.

The third switch 72 can electrically connect the bias currents applied to the first power amplifier portion 34a and the second power amplifier portion 34b in certain modes of operation. For instance, the third switch 72 can electrically connect the source of the first switch 70 and the source of the second switch 71 in a high power mode of operation. In this way, the third switch 72 can electrically connect the node $RFQ_A$ and the node $RFQ_B$. For instance, when the third switch 72 is a field effect transistor, the drain can be coupled to the node $RFQ_A$ and the source can be coupled to the node $RFQ_B$. In some implementations, the third switch 72 can be turned on when a high power control signal HIGH_MODE is asserted. This can balance the first and second bias currents $I_{BA}$ and $I_{BB}$ provided to the first power amplifier portion 34a and the second power amplifier portion 34b, respectively, during the high power mode. When the power amplifier system 25 enters a low power mode, the high power control signal HIGH_MODE can be de-asserted and the third switch 72 can be turned off. In this way, the third switch 72 can electrically isolate the node $RFQ_A$ and the node $RFQ_B$. This can electrically isolate the current paths to inputs of the first power amplifier portion 34a and the second power amplifier portion 34b. For example, the source of the first switch 70 and the source of the second switch 71 can be electrically isolated by turning off the third switch 72.

As illustrated in FIG. 7, a fourth switch 73 can turn off the second switch 71 in a low power mode of operation. For example, in some implementations, the low power control signal LOW_MODE can be asserted during a low power mode and the switch fourth switch 73 can apply a voltage to a control terminal of the second switch 71 such that the second switch is off and does not provide bias current to an input of the second power amplifier portion 34b. The control terminal of the second switch can be the gate of the second switch 71 when the second switch 72 is a field effect transistor. Turning the second switch 71 off can turn off the second power amplifier portion 34b and thereby reduce power consumed by the power amplifier system 25 in low power mode.

As also illustrated in FIG. 7, a fifth switch 74 can prevent the second power amplifier portion 34b from turning on in the low mode. For example, when the low power control signal LOW_MODE is asserted, the fifth switch 74 can apply a voltage at an output terminal, such as the source, of the second switch 71. This can prevent the second power amplifier portion 34b from turning on in a low power mode. As such, the fifth switch 74 can also prevent the power amplifier system 25 from consuming excess power in the low power mode.

The first power amplifier portion 34a and the second power amplifier portion 34b are each configured to receive an RF signal on the input terminal RF_IN and to generate an amplified RF signal on the output terminals RF_OUTA and RF_OUTB, respectively. The output terminals RF_OUTA and RF_OUTB can be coupled to each other. In some implementations, the output terminals RF_OUTA and RF_OUTB can be coupled to each other via one or more impedance matching circuit elements. The first power amplifier portion 34a and the second power amplifier portion 34b can be sized relative to each other to create an amplified RF output of a desired power level.

The first power amplifier portion 34a and the second power amplifier portion 34b can include identical or functionally similar circuit elements. For illustrative purposes, the first power amplifier portion 34a will be described in more detail. The illustrated first power amplifier portion 34a includes a bipolar transistor 83a having an emitter, a base, and a collector. The emitter of the bipolar transistor 83a can be electrically connected to a first supply voltage, which can be, for example, a ground node as illustrated in FIG. 7. The base of the bipolar transistor 83a can be electrically connected to the input terminal RF_IN, which can be used to provide an RF signal to the first power amplifier portion 34a. The base of the bipolar transistor 83a is configured to receive a bias current $I_{BA}$ from the common bias circuit 67. The output of the first power amplifier portion 34a is electrically connected to the output terminal RF_OUTA. The bipolar transistor 83a can amplify an RF signal received on the input terminal RF_IN and to generate an amplified version of the RF signal on the output terminal RF_OUTA. Although the first power amplifier portion 34a is illustrated as including the bipolar transistor 83a, in some implementations the bipolar transistor 83a can be omitted in favor of a field-effect transistor (FET). The second power amplifier portion 34b can be functionally similar to the first power amplifier portion, except that the base of the bipolar transistor 83b is configured to receive a bias current $I_{BB}$ from the mode control circuit 68. By providing a different bias current to the base of the bipolar transistor 83b, the second power amplifier portion 34b can be off during modes of operation where the first power amplifier portion 34a is on.

Although the power amplifier systems 25 illustrated in FIGS. 3 and 7 include two power amplifier portions, it will be understood that the principles and advantages described herein can be applied to power amplifier systems that include three or more power amplifier portions. In some implementations, an additional mode control circuit 68 can be included in the power amplifier system 25 for each additional power amplifier portion. For instance, a second mode control circuit can be included to selectively activate a third power amplifier portion. The second mode control circuit can include any combination of features described with reference to the mode control circuits 68 described herein. The second mode control circuit can receive the same inputs from the common bias circuit 67 as the mode control circuit 68. The second mode control circuit can generate a bias current in response to different control signals than the mode control circuit 68 such that the third power amplifier portion can be activated and/or deactivated in at least one different mode of operation than the second power amplifier portion 34b. Similarly, a third mode control circuit can be included to selectively activate a fourth power amplifier portion. Furthermore, additional mode control circuits can be included to activate and/or deactivate any suitable number of power amplifier portions.

The power amplifier system 25 can include a bias network to bias the power amplifier portions 34a, 34b with a power amplifier supply voltage $V_{CC2}$. In some implementations, the control circuit supply voltage $V_{CC1}$ and the power amplifier supply voltage $V_{CC2}$ can have approximately the same voltage level. The bias network can include a choke inductor 84a, 84b and a bypass capacitor 85a, 85b. The choke inductor 85a, 85b can include a first end electrically connected to the power amplifier supply voltage $V_{CC2}$ and a second end electrically connected to the collector of the bipolar transistor 83a, 83b.

The bypass capacitor 85a, 85b can include a first end electrically connected to the first end of the choke inductor 84a, 84b and a second end electrically coupled to the first supply voltage, which can be coupled to a ground node. The bypass capacitor 85a, 85b can be configured to provide a low impedance path to high frequency signals.

FIGS. 8A and 8B are schematics diagrams of illustrative control circuits 65 for controlling amplification circuits, according to various embodiments. FIGS. 8A and 8B provide additional detail about some example control circuits 65 and each illustrate a different example embodiment of the mode control circuit 68.

As illustrated in FIGS. 8A and 8B, the control circuit supply voltage $V_{CC1}$ can be generated based on a battery voltage $V_{BAT}$ and an enable bias voltage output $V_{EN\_BIAS}$. In some implementations, the enable bias voltage output $V_{EN\_BIAS}$ can be provided by the enable circuit 30 illustrated in FIG. 4. A field effect transistor 87 can have a gate coupled to the enable bias voltage output $V_{EN\_BIAS}$, a source coupled to the battery voltage $V_{BAT}$ and a drain coupled to the control circuit supply voltage $V_{CC1}$. In some implementations, a resistor 86 can be coupled in between the enable bias voltage output $V_{EN\_BIAS}$ and the gate of the field effect transistor 87. A diode 88 can be coupled in between the drain of the field effect transistor 87 and the control circuit supply voltage $V_{CC1}$.

A diode connected transistor 90 can be coupled to output of the source of the first switch 70. For instance, the source of the first transistor 70 can be coupled to a first end of a resistor 89 and a second end of the resistor 89 can be coupled to the diode connected transistor 90. The second end of the resistor 89 can be coupled to the emitter of the diode connected transistor 90. The diode connected transistor 90 can be a bipolar transistor having a collector coupled to ground, an emitter coupled to an input of the first power amplifier portion 34a, and a based coupled to emitter.

The example mode control circuits 68 of FIGS. 8A and 8B can control the second bias current $I_{BB}$ provided to an input of the second power amplifier portion based on a mode control signal $V_{MODE}$. As illustrated, the mode control signal can be coupled to the gate of the third switch 72 via a resistor 91. The mode control signal $V_{MODE}$ can toggle when the power amplifier system 25 changes modes of operation, for example, from a low power mode of operation to a high power mode of operation or from a high power mode of operation to a low power mode of operation. The mode control signal $V_{MODE}$ can turn on the third switch 72 during a high power mode and turn off the turn on the third switch 72 during a low power mode. In this way, the second power amplifier portion 34b can be turned off in the low power mode and turned on in the high power mode.

The mode control circuit 68 of FIG. 8A can turn off the second switch 71 via a field effect transistor 93 having a gate, a source, and a drain. For example, the mode control signal $V_{MODE}$ can be applied to the source of the field effect transistor 93. The drain of the field effect transistor 93 can be coupled to a control terminal, such as a gate, of the second switch 71. The gate of the field effect transistor 93 can be coupled to a diode connected transistor 92. For instance, the diode connected transistor 92 can have a source coupled to a ground node, a gate coupled to the source, and a drain coupled to the gate of the field effect transistor 93.

The mode control circuit 68 of FIG. 8A can also prevent the second power amplifier portion 34b from turning on via a field effect transistor 95 having a gate, a source, and a drain. For example, the mode control signal $V_{MODE}$ can be applied to the source of the field effect transistor 95. The drain of the field effect transistor 95 can be coupled to a terminal, such as a source, of the second switch 71 driving the second bias current $I_{BB}$. A diode 96 can be coupled between the drain of the field effect transistor 95 and the terminal driving the second bias current $I_{BB}$. The gate of the field effect transistor 95 can be coupled to a diode connected transistor 94. For instance, the diode connected transistor 94 can have a source coupled to a ground node, a gate coupled to the source, and a drain coupled to the gate of the field effect transistor 94.

The mode control circuit 68 of FIG. 8B can turn off the second switch 71 via a diode 97. For example, the mode control signal $V_{MODE}$ can be applied to a cathode of the diode 97 and an anode of the diode can be coupled to a control terminal, such as a gate, of the second switch 71. In this way, the diode 97 can control whether the second switch 71 provides current to the input of the second power amplifier portion 34b.

The mode control circuit 68 of FIG. 8B can prevent the second power amplifier portion 34b from turning on via a diode 98. For example, the mode control signal $V_{MODE}$ can be applied to a cathode of the diode 98 and an anode of the diode can be coupled to a terminal, such as a source, of the second switch 71 that drives the input of the second power amplifier portion 34b. In this way, the diode 98 can prevent the second power amplifier portion 34b from turning on when the second switch 71 is off and not driving the second bias current $I_{BB}$.

In some implementations, the diode 97 and/or the diode 98 can include a Schottky diode. Schottky diodes are semiconductor diodes that can have a low forward voltage drop and fast switching action. Schottky diodes can have a metal-semiconductor junction formed between a metal and a semiconductor, creating a Schottky barrier. Typical metals used to form the metal-semiconductor junction can include molybdenum, platinum, chromium, tungsten, the like, or any combination thereof. The semiconductor can be, for example, N-type silicon. The metal side can operate as the anode and semiconductor can operate as the cathode of the diode. In some implementations, a Schottky diode can have a voltage drop between approximately 0.15-0.45 Volts. Such a voltage drop can result in a high switching speed that is suitable for RF application and/or better system efficiency compared to some other silicon diodes.

Figure 9:
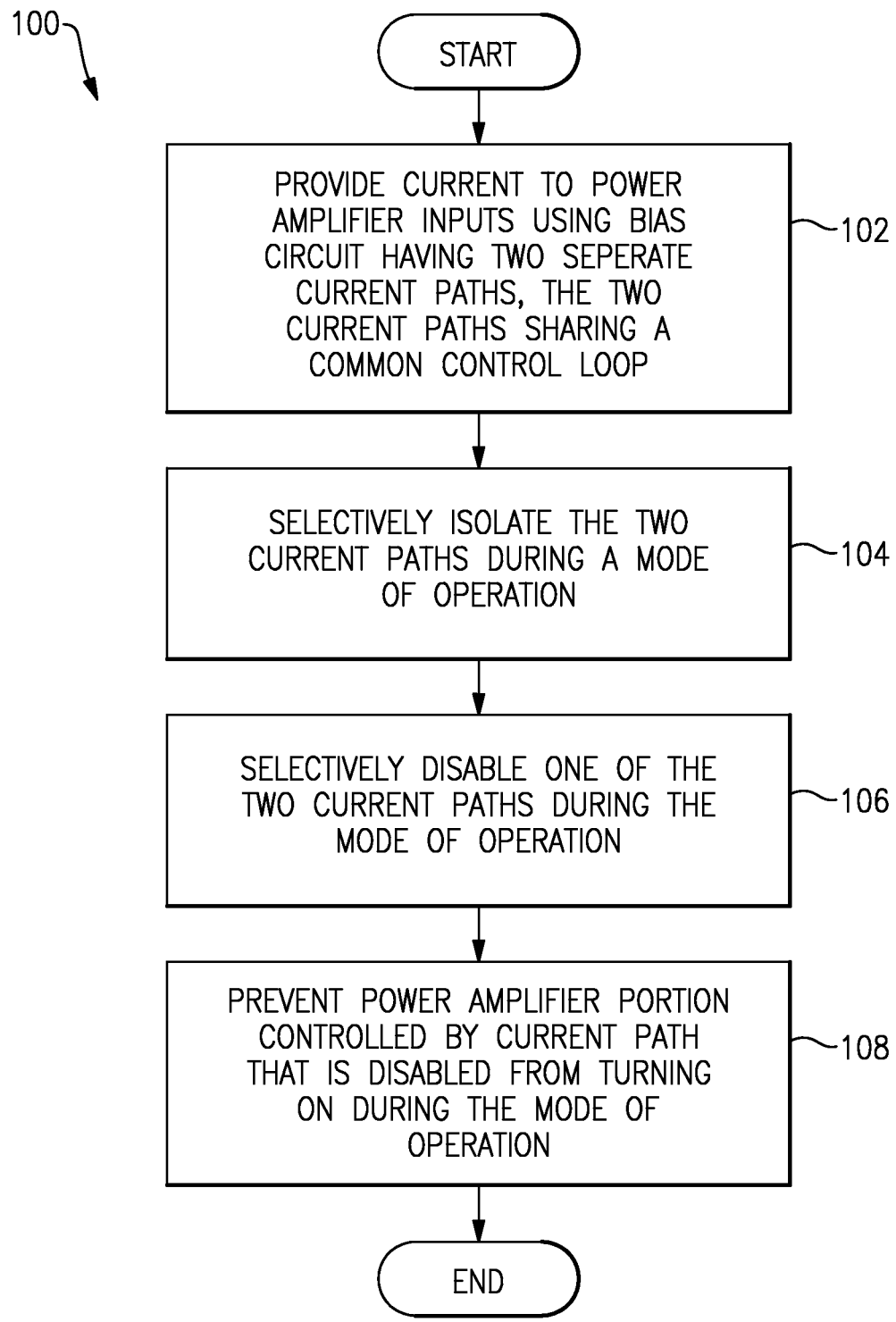
FIG. 9 is a flow diagram of an illustrative method of controlling a power amplifier according to an embodiment.

FIG. 9 is a flow diagram of an illustrative method 100 of controlling a power amplifier according to an embodiment. The method 100 can selectively activate and deactivate a power amplifier portion in certain modes of operation. At block 102, bias current can be provided to power amplifier portions via a bias circuit having at least two current paths. The two current paths can share a common control loop. The common control loop can include, for example, a baseband impedance control element. Bias current from the two current paths can the power amplifier portions in parallel at block 104. The two current paths can be isolated at block 106. A first current path of the two current paths can be disabled while the two current paths are isolated at block 108. The method 100 can also include preventing a power amplifier portion controlled by the first current path from activating when the first current path is disabled. Alternatively or additionally, the method 100 can include electrically connecting the two current paths and enabling the first current path, after the isolating the two current paths and the disabling first current path of the two current paths.

Applications

Some of the embodiments described above have provided examples in connection with mobile phones and/or power amplifier systems. However, the principles and advantages of the embodiments can be used for any other systems or apparatus that have needs for amplification circuits and/or power amplifiers.

Such power amplifier systems and/or amplification circuits can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone (for example, a smart phone), a telephone, a television, a computer monitor, a computer, a hand-held computer, a laptop computer, a tablet computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
   a power amplifier having at least a first portion and a second portion; and
   a control circuit including
      a first switch configured to provide a first bias current to the first portion of the power amplifier;
      a second switch configured to provide a second bias current to the second portion of the power amplifier in a first mode of operation; and
      a third switch configured to electrically connect an output of the first switch and an output of the second switch in the first mode of operation and to electrically isolate the output of the first switch and the output of the second switch in a second mode of operation.

2. The system of claim 1 wherein bias currents applied to the first portion of the power amplifier and the second portion of the power amplifier are substantially balanced in the first mode of operation.

3. The system of claim 1 wherein the control circuit includes one or more circuit elements configured to turn on both the first switch and the second switch.

4. The system of claim 1 wherein the control circuit includes a fourth circuit element configured to turn off the second switch in the second mode of operation, so as to turn off the second portion of the power amplifier.

5. The system of claim 4 wherein the first switch, the second switch, the third switch, and the fourth circuit element each include a GaAs transistor.

6. The system of claim 4 wherein the fourth circuit element is a field effect transistor.

7. The system of claim 4 wherein the fourth circuit element is a diode.

8. The system of claim 4 wherein the control circuit includes a fifth circuit element configured to prevent the second switch from turning on during the second mode of operation.

9. The system of claim 8 wherein the fifth circuit element includes at least one of a field effect transistor or a diode.

10. The system of claim 1 wherein each of the first switch, the second switch, and the third switch include a field effect transistor.

11. The system of claim 10 wherein each of the first switch, the second switch, and the third switch are CMOS devices.

12. The system of claim 1 wherein the first switch and the second switch are each configured as a source follower.

13. The system of claim 1 further including an enable circuit configured to selectively provide current from a voltage source to generate at least one of the first input voltage or the second input voltage based on an enable input, the enable circuit configured to pass substantially all of the current from the voltage source through one or more circuit elements driving the current from the enable circuit when the enable circuit is enabled.

14. A control circuit comprising:
 a first switch configured to provide a first bias current to a first portion of an amplification circuit;
 a second switch configured to provide a second bias current to a second portion of the amplification circuit in a first mode of operation; and
 a third switch configured to electrically connect an output of the first switch and an output of the second switch in the first mode of operation and to electrically isolate the output of the first switch and the output of the second switch in a second mode of operation.

15. The control circuit of claim 14 wherein the first mode of operation is a high power mode and the second mode of operation is a low power mode.

16. The control circuit of claim 14 further including a fourth circuit element configured to turn off the second switch in the second mode of operation, so as to turn off the second portion of the amplification circuit.

17. The control circuit of claim 16 wherein the fourth circuit element includes at least one of a field effect transistor or a diode.

18. The control circuit of claim 16 further including a fifth circuit element configured to prevent the second switch from turning on during the second mode of operation.

19. A method of controlling a power amplifier, the method comprising:
 providing current to power amplifier portions via a control circuit having at least two current paths to the power amplifier portions, the two current paths sharing a common control loop;
 providing current to the power amplifier portions via the two current paths;
 selectively isolating the two current paths; and
 disabling a first current path of the two current paths while the two current paths are selectively isolated.

20. The method of claim 19 further including preventing a power amplifier portion controlled by the first current path from activating when the first current path is disabled.

21. The method of claim 19 further including electrically connecting the two current paths and enabling the first current path, after the selectively isolating and the disabling.

22. An electronic system comprising an enable circuit including BiFET devices, the enable circuit configured to selectively provide current from a voltage source to a bias output based on an enable input, the enable circuit configured to pass substantially all of the current from the voltage source through one or more of the BiFET devices driving the bias output when the enable circuit is enabled.

* * * * *